(12) United States Patent
Nikitin et al.

(10) Patent No.: US 7,799,601 B2
(45) Date of Patent: Sep. 21, 2010

(54) ELECTRONIC DEVICE AND METHOD OF MANUFACTURING SAME

(75) Inventors: Ivan Nikitin, Regensburg (DE);
Manfred Mengel, Bad Abbach (DE);
Beer Gottfried, Nittendorf (DE);
Henrik Ewe, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 170 days.

(21) Appl. No.: 12/018,847

(22) Filed: Jan. 24, 2008

(65) Prior Publication Data

US 2009/0191665 A1    Jul. 30, 2009

(51) Int. Cl.
*H01L 21/00* (2006.01)
(52) U.S. Cl. .................. 438/106; 257/668; 257/E23.06
(58) Field of Classification Search .................. 438/106; 257/666–668, 23.06, 734–786
See application file for complete search history.

(56) References Cited

U.S. PATENT DOCUMENTS

| 6,457,234 | B1 * | 10/2002 | Edelstein et al. .............. 29/843 |
| 2004/0026254 | A1 | 2/2004 | Hupe et al. |

FOREIGN PATENT DOCUMENTS

| DE | 102006017630 A1 | 1/2008 |
| DE | 102007032636 A1 | 1/2008 |
| WO | 9925474 A1 | 5/1999 |
| WO | 2007115546 A2 | 10/2007 |

* cited by examiner

*Primary Examiner*—Davienne Monbleau
*Assistant Examiner*—Monica D Harrison

(57) ABSTRACT

This application relates to a method of manufacturing an electronic device comprising placing a first chip on a carrier; applying an insulating layer over the first chip and the carrier; applying a metal ions containing solution to the insulating layer for producing a first metal layer of a first thickness; and producing a second metal layer of a second thickness on the insulating layer wherein at least one of the first metal layer and the second metal layer comprises at least a portion that is laterally spaced apart from the respective other metal layer.

18 Claims, 10 Drawing Sheets

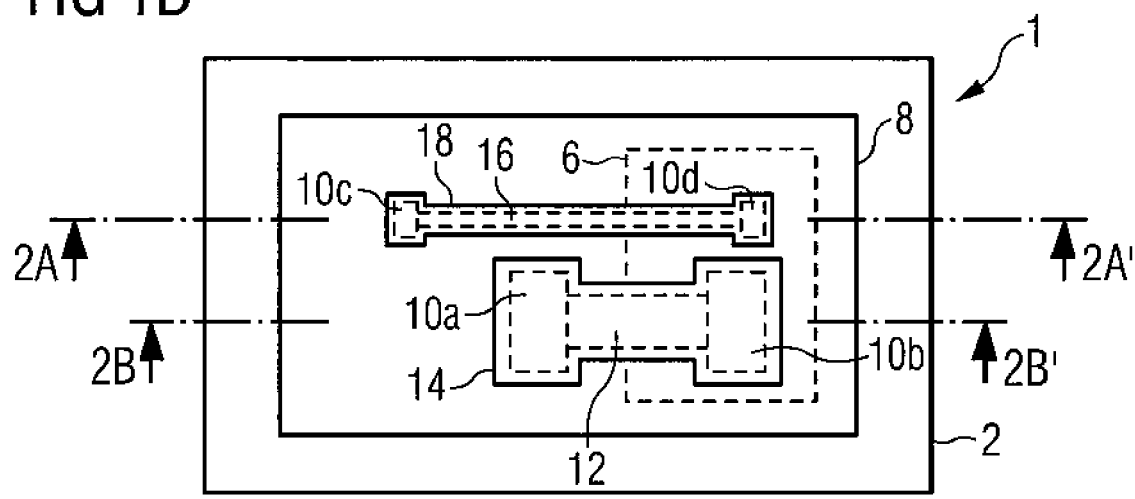
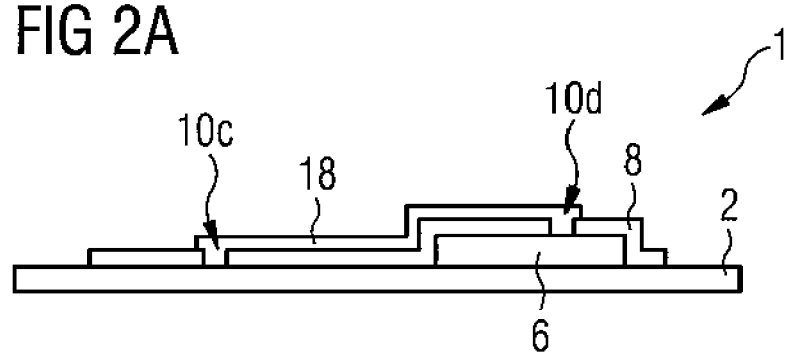
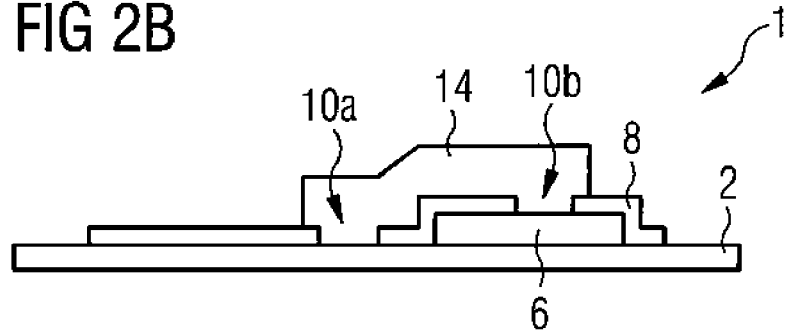

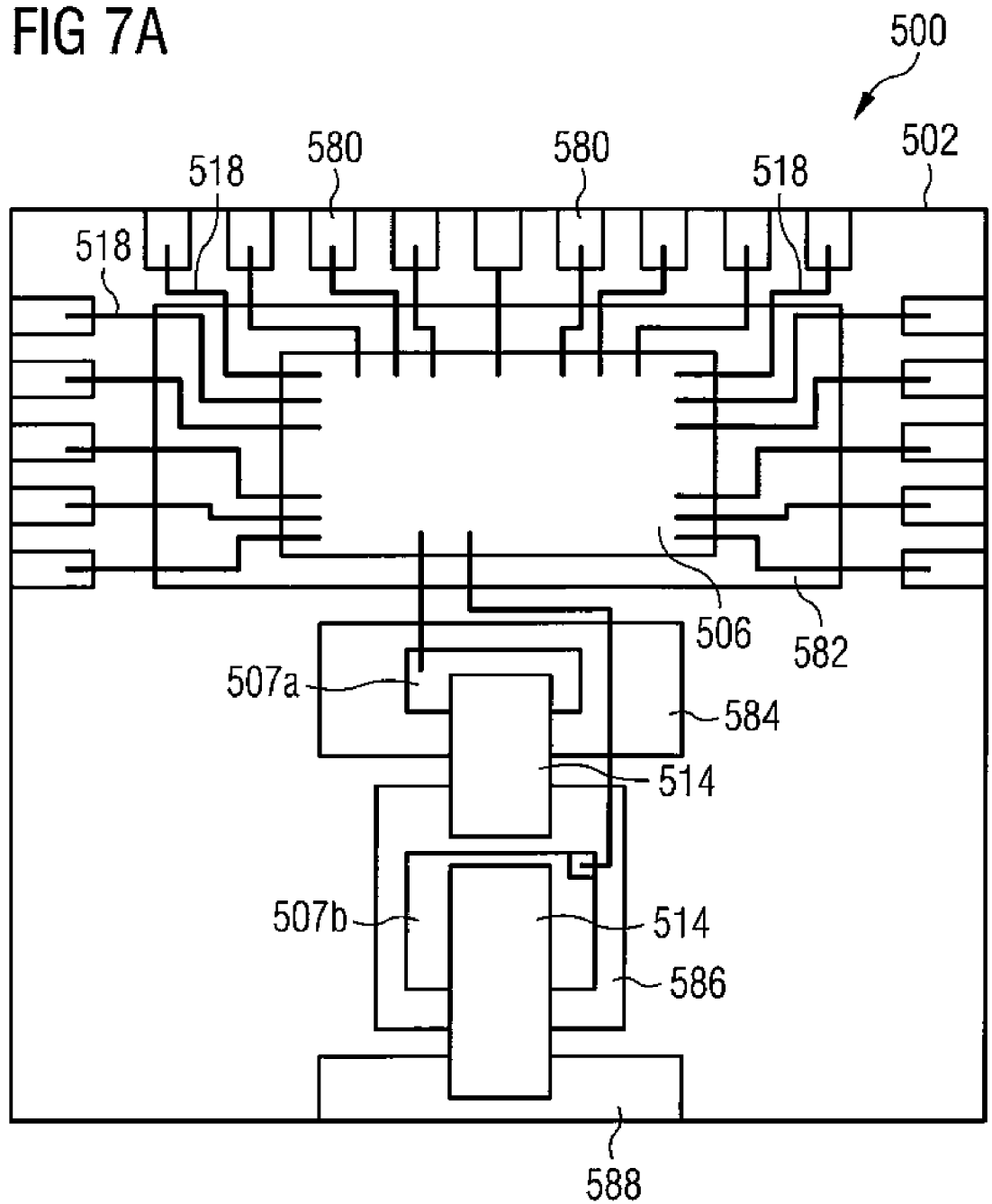

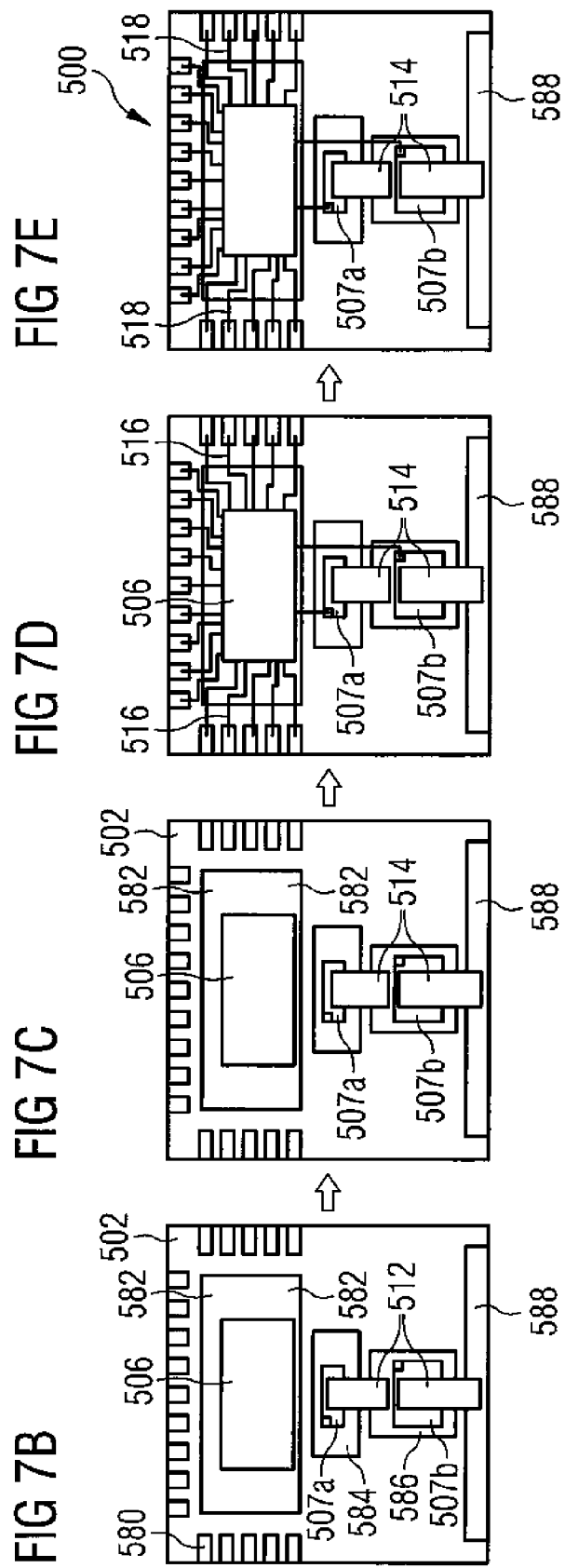

ELECTRONIC DEVICE AND METHOD OF MANUFACTURING SAME

TECHNICAL FIELD

The present invention relates to a semiconductor device and methods of manufacturing semiconductor devices.

BACKGROUND

In the wake of an ever increasing level of function integration in semiconductor devices, the number of input/output channels of semiconductor devices has been rising continuously. At the same time, there is a demand to shorten signal channel lengths for high frequency applications, improve heat dissipation, reduce internal ohmic resistance, improve robustness, and to decrease manufacturing costs. This represents significant challenges to the way by which silicon chips in the semiconductor devices are packaged.

SUMMARY

Accordingly, there is provided a method of manufacturing an electronic device comprising placing a first chip on a carrier; applying an insulating layer over the first chip and the carrier; applying a metal ions containing solution to the insulating layer for producing a first metal layer of a first thickness; and producing a second metal layer of a second thickness on the insulating layer wherein at least one of the first metal layer and the second metal layer comprises at least a portion that is laterally spaced apart from the respective other metal layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A-1D schematically disclose a first embodiment of the method of manufacturing an electronic device.

FIGS. 2A and 2B schematically disclose two cross section views through the semiconductor device manufactured according to the method disclosed in FIGS. 1A-1D.

FIG. 7A schematically discloses an electronic device with a first metal layer of a first thickness (thick) connected to two power chips, and a second metal layer of a second thickness (thin) connected to a logic chip.

FIGS. 7B to 7E schematically discloses a method of manufacturing the electronic device disclosed in FIG. 7A.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein. Therefore, it is intended that this invention be limited only by the claims and the equivalents thereof.

Figure 1A:
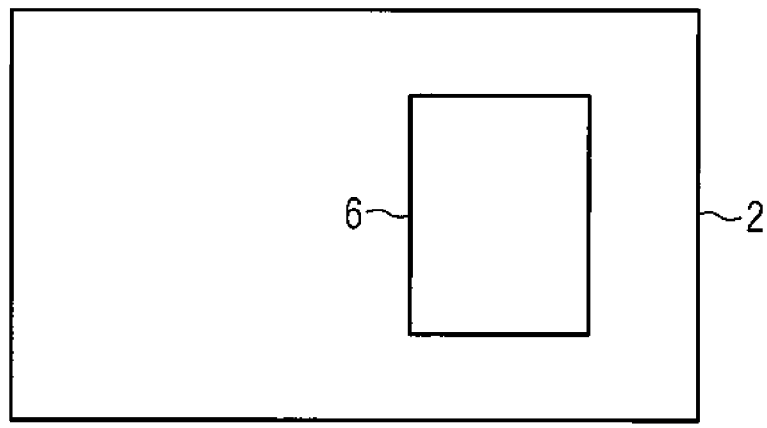

FIGS. 1A-1D schematically disclose an embodiment of a method of manufacturing an electronic device by illustrating top views on the processed electronic device at various manufacturing steps. FIG. 1A discloses a carrier 2, and a first chip 6 placed on the carrier. Carrier 2 may be of any type that is appropriate for carrying a chip. For example, carrier 2 may be a plate or structure to which chip 2 is attached, e.g. by gluing, or soldering. Carrier 2 may also be made of an electrically conducting material like, e.g. a metal like copper, of an electrically insulating material like, e.g., a ceramic or plastic, of a laminate that consists of alternating layers of electrically conducting and insulating layers, of a foil or tape, etc. Further, the shape of carrier 2 may be that of a plate, a tape, a leadframe strip, wafer, etc. Further, carrier 2 may consist of an array of individual carriers onto each of which one or several chips are placed. In this case, the method of manufacturing an electronic device can be carried out for each of the chips in parallel (batch mode). Various embodiments of electronic devices with various carrier types will be shown in more detail later.

Chip 6 may be any type of semiconductor chip. It may include, e.g. an integrated circuit, sensor elements like pressure sensor, acceleration sensor, gas sensor, optoelectronic elements like photodiodes, optically active elements like a laser, and the like. Also, as will be shown below, embodiments may include semiconductor chips that have power transistors for switching high electronic currents and/or high voltages. For example, chip 6 may include one or several Insulated Gate Bipolar Transistors (IGBT) that each have a source on one face of the chip and a drain on the opposite face of the chip. Such chips may be capable of controlling currents of 10 A or higher, and withstanding voltages up to 1000 V, or higher.

Depending on the application, the placement of chip 6 on carrier 2 may include gluing the chip to the carrier, soldering the chip to the carrier, or sintering the chip to the carrier. For example, if chip 6 comprises a power transistor for controlling a large current from a first face of the chip the opposite face of the chip, the chip may be soldered to the carrier in order provide a low ohmic resistance between the carrier 2 and the chip 6.

Figure 1B:
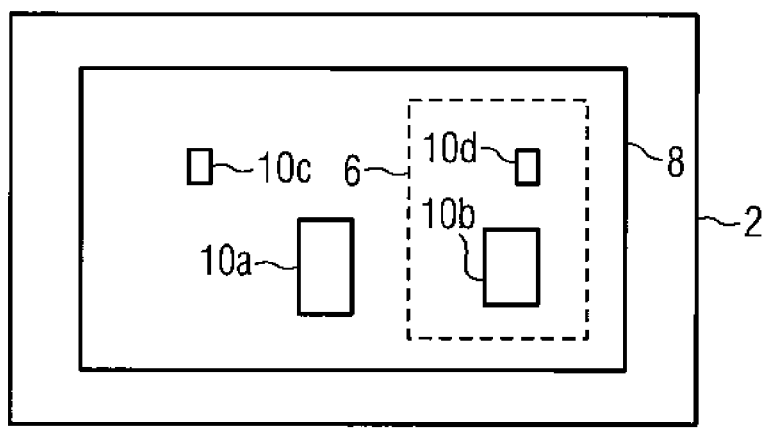

FIG. 1B illustrates the electronic device of FIG. 1A after having applied an insulating layer 8 over first chip 6 and carrier 2. As can be seen in the figure, insulating layer 8 covers a region of carrier 2, chip 6, and the edge of chip 6. For illustrational purposes, the position of chip 6 on carrier 2 underneath insulating layer 8 is indicated by dotted lines. As will be explained in more detail later, insulating layer 8 may be a layer made of an anorganic material, e.g., silicon oxide, silicon nitride, amorphous Si—O—H carbon, of ceramic compounds like silicone carbide, or of aluminum nitride. Alternatively, insulating layer may be made of an organic material, e.g., polymer like polyimide, epoxy resin, acrylate, Parylene, BCB. Depending on the type of insulating material, insulating layer 8 may be applied in traditional ways, e.g. from a liquid phase by needle dispensing, spin on or dip coating, or printing. Printing may include the known techniques of stencil print, screen print or inkjet print. Alternatively, insulating layer 8 may be deposited out of a gas phase via sputtering, spray coating or plasma gas phase deposition like chemical vapour deposition (CVD) or physical vapour deposition (PVD).

In one embodiment that will be explained later in more detail, insulating layer 8 is made of a polymer that contains metal particles, or metal complexes, that become exposed to the surface of the layer once the polymer is irradiated with electromagnetic radiation.

The thickness of insulating layer 8 may be chosen depending on the application and complexity of the structure on chip 6. Generally, the thickness should not fall below a given minimum to make sure that insulating layer 8 withstands the voltages used during module operation. The minimum thickness also depends on the material used for insulating layer 8. For example, if insulating layer 8 is made of an anorganic material, the minimum thickness should be larger than, say, 1 micrometers while, if insulating layer 8 is made of an organic material, the minimum thickness should be larger than 5 micrometers. Further, if chip 6 has several contact elements spaced apart at a pitch of less than 100 micrometers, it is useful to have the thickness of insulating layer 8 above chip 6 be of a similar size, or smaller, for securely accessing the contact elements from above through openings 10b, 10d in insulating layer 8. On the other hand, if the application involves high voltages, or if chip 6 comprises merely one transistor with two or three contact elements on top, the thickness of insulating layer 8 may be as large as 1 millimeter or more without jeopardizing a secure electronic access from above through insulating layer 8. Note that insulating layer 8 may extend conformally over the chip, the carrier and the edge of the chip, or be planarized to provide a flat surface for the metal layers that are to be produced on insulating layer 8.

In the embodiment of FIG. 1B, insulating layer 8 comprises one large opening 10a to contact carrier 2 from above, one large opening 10b to contact chip 6 from above, one small opening 10c to contact carrier 2 from above, and one small opening 10d to contact chip 6 from above. The size of the openings may be chosen according to the size of the contact elements of the chip or carriers, and on the currents that are expected to flow through the respective openings. The openings 10a, 10b, 10c, 10d may be produced in various known ways, e.g. by laser irradiation, by etching the insulating layer 8 selectively to a mask, etc.

Figure 1C:
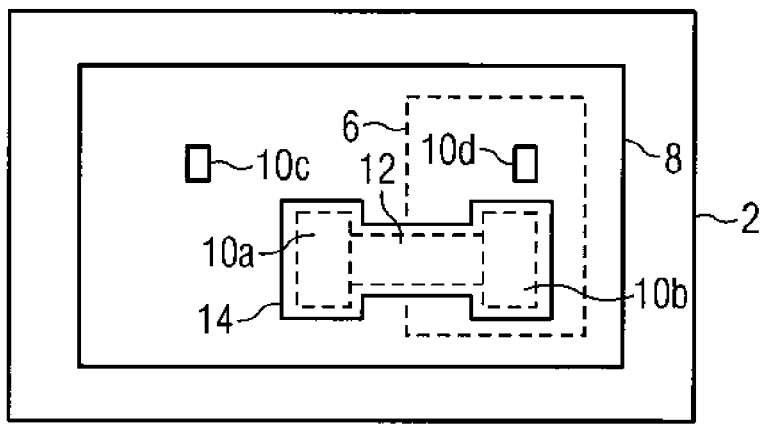

FIG. 1C discloses the electronic device of FIG. 1B after a metal ions containing solution has been applied to insulating layer 8 for producing first metal layer 14. In the present case, the metal ions containing solution has been applied such that first metal layer 14 forms a strip extending from large opening 10a above carrier 2 to large opening 10b above chip 6. This way, first metal layer 14 electrically connects chip 6 with carrier 2. Note that first metal layer 14 has a large structure width in comparison to the minimum structure width of second metal layer 18 that will be produced later (see FIG. 1D). The large structure width is intended to enable a low resistance connection between chip 6 and carrier 2. A low resistance connection may, for example, be advantageous for applications where chip 6 comprises a power transistor intended for switching a large current. In this case, the large structure width makes sure that voltage drop caused by the switching of a high current kept small.

The metal ions containing solution may be applied to insulating layer 8 in several ways. In one embodiment, the metal ions containing solution is applied by selectively depositing the metal ions containing solution to desired regions on insulating layer 8, e.g. with ink-jetting dispenser. In this case, after drying the metal ions containing solution, a first electrically conducting metal layer 14 has been formed in the regions where the metal ions containing solution was applied.

In the embodiment shown in FIG. 1C, first metal layer 14 is produced by first producing a first structure 12 (dotted line) on insulating layer 8 followed by applying the metal ions containing solution over insulating layer 8. Since first structure 12 is capable of selectively interacting with the metal ions containing solution, the metal ions containing solution remains selectively in the region of the first structure 12 to form first structure 12. The use of a structure 12 makes it obsolete to apply the metal ions containing solution selectively to insulating layer 8. Rather, with structure 12, it is sufficient to immerse insulating layer 8 into the metal comprising solution to obtain a desired structured first metal layer 14.

In one embodiment, first structure 12 is made to serve as a seed layer for growing first metal layer 14 that is to electrically connect chip 6 to carrier 2. The seed layer structure 12 may be produced in several ways, depending on the material of insulating layer 8 and on the required structure size. For example, if insulating layer 8 is made of metal particle containing polymer, seed layer structure 12 may be produced by irradiating insulating layer 8 with a laser beam until sufficient metal particles become exposed along the irradiated locations of insulating layer 8 to form the seed layer. In another embodiment, seed layer structure 12 may be produced by selectively applying a conducting liquid to insulating layer 8 that, after drying, forms the seed layer. In a further embodiment, seed layer structure 12 may be produced by applying an electroconductive layer over insulating layer 8 and, subsequently, selectively removing regions of the electroconductive layer by using, e.g., laser ablation or photolithographic processes. Techniques for applying the electroconductive layer include needle dispensing, spin on coating or dip coating. In this case, the remaining of the electroconductive layer forms the seed layer structure. Further known techniques for producing a seed layer structure on insulating layer 8 include ink-jetting with an electrically conductive ink, ink-jetting with a catalytic ink, tampon, screen or stencil printing an electrically conductive paste, selectively needle dispensing, selectively spray coating an electroconductive layer, etc.

After production of seed layer structure 12, first metal layer 14 is produced in a process in which seed layer structure 12 is exposed to a solution containing solved metal ions to form, during an electrochemical process, first metal layer 14 on seed layer structure 12. In one embodiment, for forming first metal layer 14, insulating layer 8 may be completely immersed in, or covered by, the metal ions containing solution. In this case, due to the selectivity of the electrochemical process, the metal ions in the metal ions containing solution selectively adhere to seed layer structure 12 to form first metal layer 14 adapted to seed layer structure 12. Further, if seed layer structure 12 forms a conducting region, a voltage may be applied between seed layer structure 12 and the metal ions containing solution to accelerate the electrochemical growth of first metal layer 14. The choice of the metal in the solution, and the detailed electrochemical process parameters depend, among others, on the type of seed layer and on the type of the metal ions containing solution, as will be explained later in more detail. Generally, electrochemical growth of a metal structure on a seed layer is a technique well known in the art. If an external voltage is applied during the electrochemical growth of the metal layers, the technique is also known as Galvanization.

In one embodiment, the thickness of first metal layer 14 is designed to be large in comparison to the thickness of second metal layer 18 that will be produced later (see FIG. 2A, 2B). The larger thickness can be obtained by exposing insulating layer 8 to the metal ions containing solution for a longer time period. With a larger thickness, less lateral space is needed on insulating layer 8 for obtaining a desired minimum cross section area, which is given by the minimum structure width of first seed layer structure 12 times the thickness of first metal layer 14. For example, if the minimum structure width of first structure 12 is ten times larger than the minimum structure width of second structure 16, and if the thickness of first metal layer 14 is ten times larger than the thickness of second metal layer 18, the cross section area of first metal layer 14 may be as large as, or larger than, 100 times the cross section area of second metal layer 18.

FIG. 1D discloses the electronic device of FIG. 1C after production of first metal layer 14 and after production of a second metal layer 18 on insulating layer 8. Like first metal layer 14, second metal layer 18 has been produced by applying a metal comprising solution to insulating layer 8 in a strip-like region extending from small opening 10c above carrier 2 to small opening 10d above chip 6. This way, second metal layer 18 provides a second connection electrically connecting chip 6 with carrier 2. Note that second metal layer 18 has a small minimum structure width in comparison to the minimum structure width of first metal layer 14. The small structure width can be used to save space on insulating layer 8 to facilitate complex circuitry on insulating layer 8 on the same insulating layer.

In the embodiment of FIG. 1D, second metal layer 18 is produced by first producing a second structure 16 on insulating layer 8 and, thereafter, by applying the metal ions containing solution to insulating layer 8. Like for first metal layer 14, second structure 16 serves as a second seed layer for second metal layer 18. In this embodiment, production of second seed layer structure 16 occurs after production of first metal layer 14. This way, second metal layer 18 may be structured such that portions of second metal layer 18 are laterally spaced apart from first metal layer 14.

Second structure 16 (second seed layer) and second metal layer 18 may be produced in any one of the ways mentioned for the design of first structure 12 and the production of first metal layer 14. In particular, the metal ions containing solutions for producing first and second metal layers 14, 18 may and may not be the same. In one embodiment, second metal layer 18 is produced by fully immersing the electronic device of FIG. 1C into the metal ions containing solution. Note that in this case, second metal layer 18 grows on second seed layer structure 16 as well as on first metal layer 14. In this case, first metal layer 14 fully overlaps second metal layer 18 while second metal layer 18 comprises portions that are laterally spaced apart from first metal layer 14. Note that, if the thickness of second metal layer 18 is significantly smaller than the thickness of first metal layer 14, the overlapping of second metal layer 18 with first metal layer 14 does not significantly increase the total cross section area of the combined first metal layer 14 and second metal layer 18 cross section areas.

Second structure 16 may also be produced in ways different from the production of first structure 12. For example, if the minimum structure width of first structure 12 is in the range of a few millimeters, first structure 12 may be produced by using the tampon printing technique. The tampon printing technique is time saving when it comes to produce large structures. On the other hand, if the minimum structure width of second structure 16 is in a range below 10 micrometers, or less, second structure 16 may be produced by a laser beam that can be focused to a spot size smaller than, say, 10 micrometer in diameter.

It should be noted that the expression "first metal layer" and "second metal layer" in this application refer to structures that have a defined thickness. At the same time, first metal layer 14 and second metal layer 18 may have any shape or structure lateral to the plane of insulating layer 8. Accordingly, due to their defined thickness, even though first metal layer 14 and second metal layer 18 may look like lines in an embodiment, they are referred to as a "layer".

FIGS. 2A and 2B schematically illustrate cross sections of the embodiment of FIG. 1D along the two cross section lines 2A-2A' and 2B-2B' shown in FIG. 1D. The cross section of FIG. 2A is a cut orthogonal to carrier 2 along the line 2A-2A', while FIG. 2B is a cut orthogonal to carrier 2 along the line 2B-2B'. FIG. 2A indicates the way by which second metal layer 18 is connected to chip 6 through opening 10d in insulating layer 8, and to carrier 2 through opening 10c. Further, FIG. 2A indicates that insulating layer 8 is conformally applied over chip 6 and carrier 2. Note that this is not a requirement since insulating layer 8 may also be planar on the upper surface. FIG. 2B looks like FIG. 2A with the difference that first metal layer 14 electrically connects chip 6 through large opening 10b with carrier 2, and to carrier 2 through large opening 10a. Further, the thickness of first metal layer 14 is at least twice as large as second metal layer 18.

With the method described in FIGS. 1A-1D and 2A-2B, an electronic device 1 can be manufactured that includes a carrier 2, a first chip 6 attached to the carrier 2, an insulating layer 8 over carrier 2 and first chip 6, a first metal layer 14 of a first metal layer thickness on insulating layer 8, and a separate second metal layer 18 of a second metal layer thickness on insulating layer 8. Further, due to the consecutive production of first metal layer 14 and second metal layer 18 on the same insulating layer 8, the thicknesses of first metal layer 14 and second metal layer 18 can be freely chosen. This way, the thicknesses can be adapted to a given application without adding an additional insulating layer between first metal layer 14 and second metal layer 18. Accordingly, a costly multi-layer design can be avoided, and circuitry with combined high voltage, high current, high speed and/or complex logic applications can be placed on the surface of an insulating layer 8 within a small area.

Figure 3A:
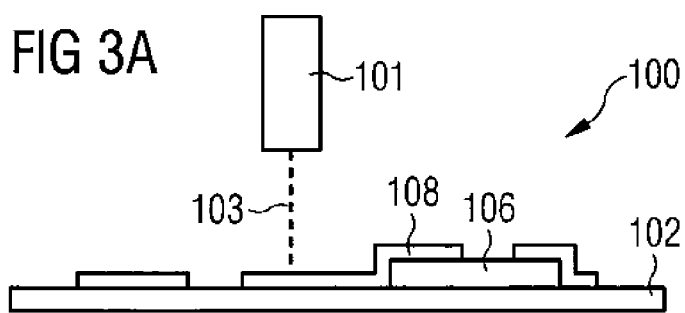
FIGS. 3A to 3F schematically disclose a further embodiment of the method of manufacturing an electronic device wherein a laser is used to produce a first and a second structure.

FIG. 3A and the processing sequence of FIGS. 3B-3F illustrate a further embodiment for the production of a first metal layer 114 and a second metal layer 118 on an insulating layer 108. In this embodiment, first metal layer 114 and second metal layer 118 are produced by producing consecutively a first seed layer structure 112 (first structure) and a second seed layer structure 116 (second structure) by a laser beam 103.

FIG. 3A illustrates an electronic device 100, which may be the same as the one shown in FIG. 2A. For example, carrier 102, chip 106, and insulating layer 108 of electronic device 100 may be the same as carrier 2, chip 6 and insulating layer 8 of FIGS. 2A and 2B. FIG. 3A further discloses laser 101 that directs a laser beam 103 onto insulating layer 108 to produce first seed layer structure 112 and second seed layer structure 116. By having laser beam 103 scan desired regions on insulating layer 108, either by moving laser beam 103 with respect to carrier 102 or by moving carrier 102 with respect to laser beam 103, laser beam 103 turns the surface on insulating layer 8 into a desired first seed layer structure 112. Examples of lasers that can be used for forming structure 112 on insulating layer 108 are, e.g., KrF-, XeCl- or Nd-YAG-laser in a wavelength range 200-11000 nm. Generally, frequency and power of the laser are adapted to the type of insulating layer material.

Figure 3B:
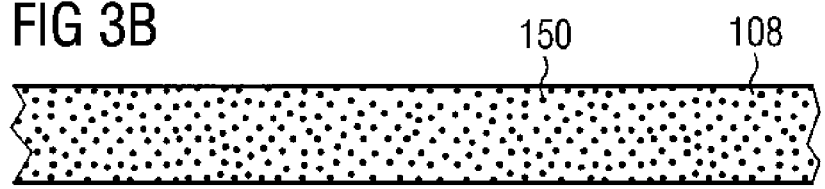

FIG. 3B discloses a schematic cross section through insulating layer 108 of embodiment of FIG. 3A in a plane perpendicular to the drawing plane. In the embodiment of FIGS. 3B-3F, insulating layer 108 is made of a polymer that contains metal particles, metal particles covered with an insulating layer, metal ceramic particles, or metal complexes. Those particles are indicated in FIGS. 3B-3F by the dots 150. The thickness of insulating polymer layer 108 may be in the range of, e.g., 0.1 to 200 micrometer, depending on the application and polymer matrix.

If particles 150 are metal particles, they are typically made of copper, alumina, nickel, silver, gold and palladium. Typically, the diameter of the metal particles is in the range of 10 to 1000 nanometers, but may be up to several micrometers. The metal particles covered with insulating layer may be of the same size. The metal complexes may consist of one or more palladium-, copper-, aluminum-, nickel-, silver-, gold-atoms and organic molecules surrounding the metal atom.

It should be noted that for producing a conducting structure 112 by laser irradiation on insulating layer 108, insulating layer 108 may also be made of inorganic materials like a ceramic, aluminum nitride, aluminum oxide, titan oxide, silicon oxide, or silicon.

Figure 3C:
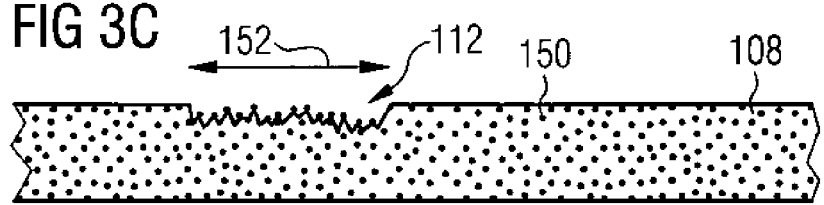

FIG. 3C discloses the schematic cross section of FIG. 3B after irradiation of insulating layer 108 by laser beam 103 to produce first seed layer structure 112. In the region where laser beam 103 has interacted with insulating layer 108, the polymer molecules of insulating layer 108 evaporate and expose particles 150 to the surface. As indicated in the FIG. 3C, the evaporation of the polymer leaves a roughened surface in the irradiated region of insulating layer 108. Further, if particles 150 are metal particles covered with a protecting insulating layer, or if the particles are metal complexes, the interaction with laser beam 103 may cause the insulating layer of the exposed particles 150, or the metal complex bonds, to break. In both cases, "naked" metal particles with a conductive surface remain on the surface of insulating layer 108. The naked metal particles 150 in turn may serve as a seed for electrochemically growing first metal layer 114 upon exposure to a metal ions containing solution.

In one embodiment, particles 150 in insulating layer 108 may be metal ceramic particles made of aluminium nitride. In this case, once laser beam 103 interacts with the exposed aluminium nitride particles, the electrically insulating aluminium nitride turns into electrically conducting aluminium and insulating aluminium oxide. In this case, the electrically conducting aluminium particles may serve as a seed 112 for electrochemically growing first metal layer 114 from the metal ions containing solution. Note that the seed layer itself may not be conductive since there may be too few seed particles to form a macroscopically conducting layer.

In another embodiment, the particles 150 may be metal particles covered with a protecting insulating layer, e.g. an oxide layer, an silicon oxide layer, an $Al_2O_3$-layer, or an insulating organic layer. The protecting layers may be produced, e.g., by thermal metal oxidation, in a chemical vapour deposition process (CVD). The protecting insulating layer on the metal particles makes sure that insulating layer 108 is macroscopically electrically insulating. Only in regions where laser beam 103 interacts with insulating layer 108, the laser may break the protecting layer to turn the insulating particles into electrically conducting particles. The electrically conducting particles in turn may serve as a seed 112 for electrochemically growing a metal layer.

In another embodiment, the particles are metal particles that are not covered with a protecting layer. In this case, it is sufficient to apply a laser beam for evaporating the surrounding polymer matrix in order to expose the metal particles to the surface to serve as a seed 112.

For illustrational purposes, FIG. 3C also shows an arrow whose length indicates a first structure width 152 of first structure 112, i.e. the width of a conducting line that is, or is part of, first metal layer 114. First structure width 152 is one parameter that determines the structure width of first metal layer 114. The structure width of first metal layer 114, in particular the minimum structure width of first metal layer 114, determines the density of conducting lines into which first metal layer 114 can be structured. Another parameter that determines the minimum structure width of first metal layer 114 is the thickness of first metal layer 114 since during production of first metal layer 114, the conducting lines of first metal layer 114 grow in vertical as well as in lateral directions (see FIG. 3D). Accordingly, the minimum structure width of first metal layer 114 is the larger the larger the thickness of first metal layer 114.

Figure 3D:
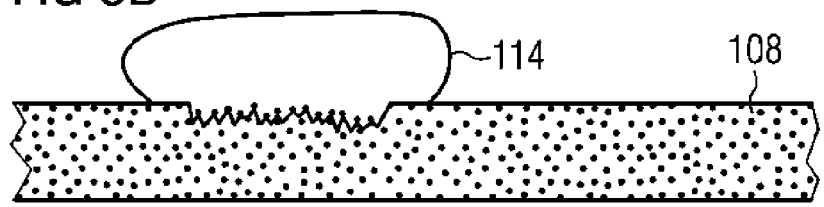

FIG. 3D discloses the schematic cross section of FIG. 3C after a metal ions containing solution has been applied to first seed layer structure 112 to form first metal layer 114. Note that due to the first seed layer structure 112, there is no need to apply the metal ions containing solution selectively to the first seed layer structure 112 since the metal ions containing solution interacts only with first seed layer structure 112 but not, or only little, with the remaining surface of polymer layer 108. This represents a significant process simplification since it is possible to obtain the desired structure of first metal layer 114 by dipping the entire insulating layer 8 into a bath of the metal ions containing solution without any need to cover insulating layer 8 in the regions where no first metal layer 114 is grown.

The choice of the metal ions containing solution depends on the metal that is to be grown on the seed layer 112. For example, solutions of copper ions, silver ions, nickel ions, or gold ions can be used (e.g. copper in alkaline potassic hydroxide solution or copper-sulphite, copper-cyanide solution). Generally, it is well known in the art what metal ions containing solution and what process parameters (solution concentration, temperature, etc) to use for a given application.

Figure 3E:
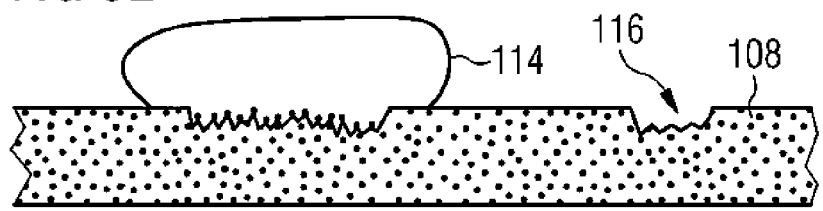

FIG. 3E discloses the schematic cross section of FIG. 3D after a second seed layer structure 116 (second structure) has been produced on insulating layer 108 for producing second metal layer 118. In this embodiment, second seed layer 116 is produced with the same laser 103 that was used for producing first seed layer structure 112. Note that due to the high focusing capability of the laser beam, the minimum structure width of second seed layer 116 may be as small as 10 micrometer, or smaller. The small structure width makes it possible to place a complex circuitry on insulating layer 108.

Figure 3F:
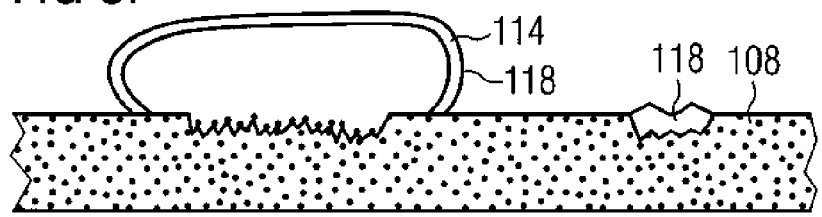

FIG. 3F discloses the schematic cross section of FIG. 3E after a second metal layer 118 has been produced on insulating layer 108 by applying a metal ions containing solution to insulating layer 108. Since the metal ions containing solution interacts only with the second seed layer structure 116 and the first metal layer 114, the second metal layer 118 grows only on second seed layer structure 116 and on first metal layer 114. In this embodiment, the process for growing second metal layer 118 is significantly shorter than for growing first metal layer 114 (e.g. ten times shorter) to obtain a significantly smaller thickness of second metal layer 118. With a smaller thickness, it is possible to produce a metal layer structure with a smaller structure width. Due to the small thickness of second metal layer 118, the total cross section area of the combined cross section areas of first metal layer 114 and second metal layer 118 is hardly affected by the growth of the additional second metal layer 118 on top of first metal layer 114. Note that in the process of FIGS. 3B to 3F, the portion of second metal layer 118 that covers second structure 116 is laterally spaced apart from first metal layer 114.

Figure 4A:
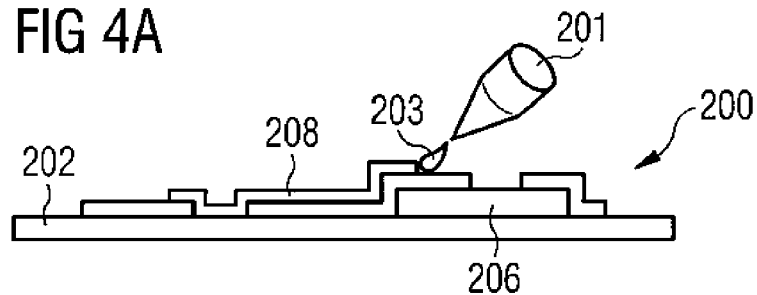
FIGS. 4A to 4F schematically disclose a further embodiment of the method of manufacturing an electronic device wherein a conducting liquid is used to produce a first and a second structure.

FIG. 4A and the processing sequence of FIGS. 4B-4F illustrates a further embodiment demonstrating the production of first metal layer 214 and second metal layer 218 on insulating layer 208 by producing consecutively a first seed layer structure 212 (first structure) and a second seed layer structure 216 (second structure). In this embodiment, first seed layer structure 212 and second seed layer structure 216 are produced by selectively applying a conducting liquid 203 to the surface of insulating layer 208.

FIG. 4A illustrates an electronic device 200 that may be the same as the one shown in FIGS. 2A and 2B. For example, carrier 202, chip 206, and insulating layer 208 of electronic device 200 may be the same as carrier 2, chip 6 and insulating layer 108 of FIGS. 2A and 2B. Further, instead of being made of a polymer layer like in FIG. 3A, insulating layer 208 may also be made of an anorganic material, e.g. ceramic, aluminum nitride, aluminum oxide, titan oxide, silicon oxide, silicon, etc. FIG. 4A further discloses a dispenser 201 that is capable of selectively applying a conducting liquid to insulating layer 208 by dispensing the conducting liquid 203 to desired regions on insulating layer 208.

The minimum structure width that dispenser 201 can create on insulating layer 208 may vary widely depending on the type of dispenser. For example, if ink-jet dispenser 201 is a micro-machined device with a jet nozzle opening smaller than 20 micrometers, the minimum structure width of the seed layers produced by the dispenser 201 may be as small as 20 micrometers. On the other hand, if the conducting liquid 203 is a paste that is dispensed by tampon printing, the minimum structure width may be larger than a millimeter.

Figure 4B:
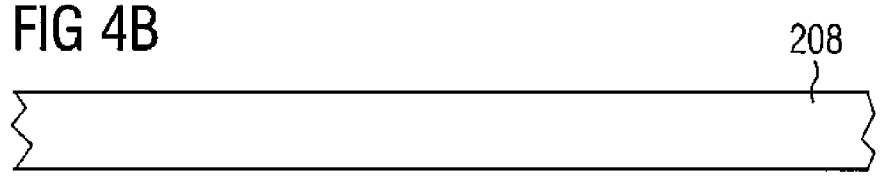

FIG. 4B discloses a schematic cross section through insulating layer 208 of the embodiment of FIG. 4A in a plane perpendicular to the drawing plane. As mentioned above, insulating layer 208 may be of organic or anorganic material. The thickness of insulating layer 208 may vary widely, depending on the application. Typical values for the thickness of insulating layer 208 are between 1 and 1000 micrometer.

Figure 4C:
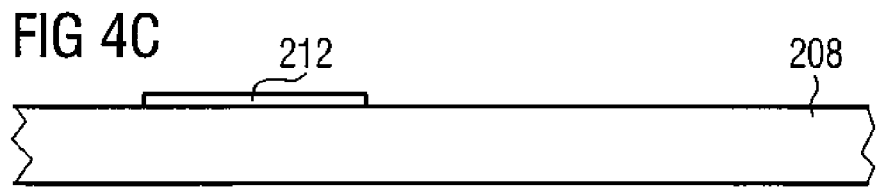

FIG. 4C discloses a schematic cross section like in FIG. 4B after conducting liquid 203 has been applied selectively to desired regions on insulating layer 208 by using dispenser 201 to form an electrically conducting first seed layer structure 212 (first structure) on insulating layer 208. The thickness of first seed layer structure 212 may be of the range, e.g. between 100 and 10,000 nanometer. At the same time, in this embodiment, the minimum structure width of first seed layer 212 is chosen to be as large as one or two millimeters to produce a first metal layer 214 of large current capability. Conducting liquid 203 may be a conducting ink containing metal atoms e.g. like silver, gold, palladium and copper.

Figure 4D:
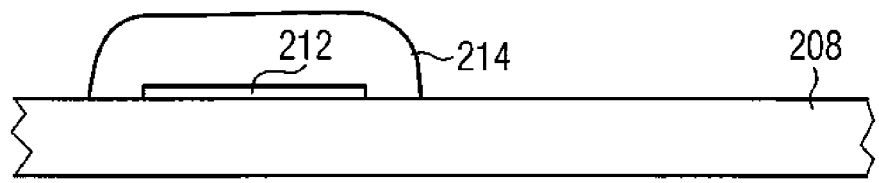

FIG. 4D discloses a schematic cross section like in FIG. 4C after applying a metal ions containing solution to insulating layer 208 to produce a first metal layer 214. Like in the previous embodiments, first metal layer 214 is produced by electrochemically growing the metal from the metal ions containing solution. Since first metal layer 214 is designed to carry large currents, the application of the metal ions containing solution to insulating layer 208 is conducted until first metal layer 214 has assumed a thickness as high as, say, 100 micrometers or more. Note that the electrochemical process can be carried out by applying an external voltage between the metal ions containing solution and first seed layer structure 212.

Figure 4E:
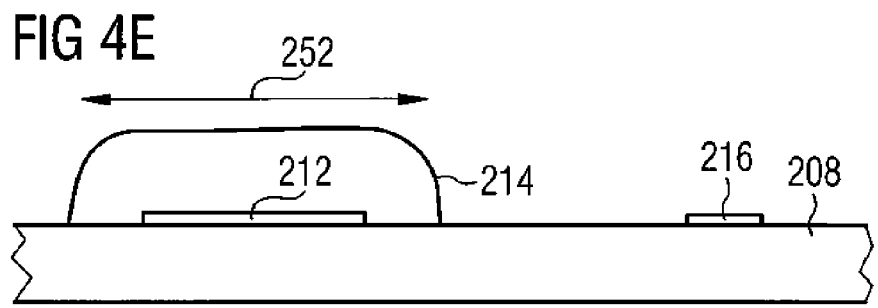

FIG. 4E discloses a schematic cross section like in FIG. 4D after a conducting liquid is applied selectively to insulating layer 208 after production of first metal layer 214. The selective application of the conducting liquid after production of first metal layer 214 may be used to produce a second seed layer structure 216 (second structure). Second seed layer structure 216 may be produced in the same way as first seed layer 212 with the difference that the minimum structure width of first seed layer structure 212 is larger than the minimum structure width of second seed layer structure 216 by a factor of 10 or more.

Figure 4F:
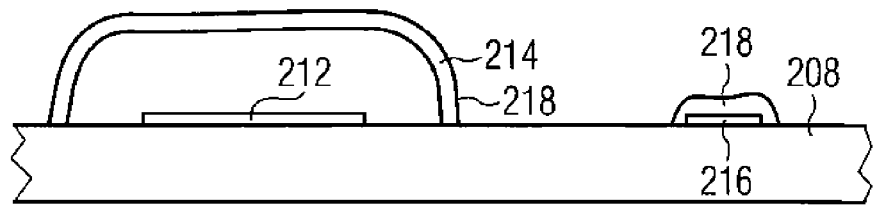

FIG. 4F discloses a schematic cross section like in FIG. 4E after metal ions containing solution has been applied to insulating layer 208 to produce second metal layer 218. Again, since the metal ions containing solution does only interact with the second seed layer structure 216 and with first metal layer 214, second metal layer 218 selectively grows only on second seed layer structure 216 and on second metal layer 218. Accordingly, there is no need to apply the metal ions containing solution selectively to the first seed layer structure 112. Rather, it is possible to obtain the desired structure of first metal layer 114 by dipping the entire insulating layer 8 into a bath of the metal ions containing solution.

Note that the application of the metal ions containing solution according to FIG. 4F is not required for the purpose of electrically connecting chip 206 with carrier 202. In this case, if the application of metal ions containing solution is omitted, the second seed layer structure 216 itself may serve a second metal layer provided the thickness and conductivity of second seed layer structure 216 is sufficient for carrying a desired current. For example, if the second seed layer structure 216 is generated by a conducting liquid comprising gold, silver or copper-nano-inks, a further metallisation via an electrochemical process is not required.

In view that first metal layer 214 is designed to carry small currents, e.g. logical signals, the electrochemical process is carried out during a short period of time in comparison to the electrochemical process used for the production of first metal layer 214. Otherwise, the production of second metal layer 218 may be the same as the production of first metal layer 214. Note that, while the cross section of first metal layer 214 also expands due its exposure to the metal ions containing solution for second metal layer 218, the effect is small due to the small thickness of second metal layer 218.

The processing sequence of FIGS. 5A-5E illustrates a further embodiment schematically demonstrating the production of first metal layer 314 and second metal layer 318 on insulating layer 308. Like in the previously described processing sequences, insulating layer 308 may be the insulating layer 8 of the electronic device 1 disclosed in FIGS. 2A and 2B.

In the present embodiment, there is only one seed layer structure 312 (first structure) that is used to generate a first metal layer 314 of a first thickness and a second metal layer 318 of a second thickness.

Figure 5A:
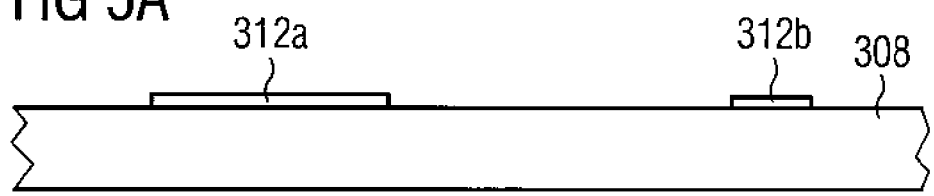
FIGS. 5A to 5E schematically disclose a further embodiment of the method of manufacturing an electronic device wherein the first metal layer is masked before producing the second metal layer.

FIG. 5A schematically discloses a cross section through insulating layer 308 that may be part of the embodiment of FIG. 1D in a plane perpendicular to the drawing plane. Like before, insulating layer 308 may be an organic or anorganic layer. Further, the thickness of insulating layer 308 may vary widely, for example, between one micrometer and one millimeters depending on the application.

FIG. 5A further discloses two elements 312a, 312b of a seed layer structure 312 on insulating layer 318. Seed layer structure 312 may be anyone of the seed layers described before, e.g. solidified conducting ink structure, a structured metal layer, or laser irradiated polymer layer with metal particles. Further, the two seed layer elements 312a, 312b may have been applied simultaneously or one after the other. The two seed layer elements 312a, 312b may, for example, have been produced by a laser, produced by dispensing a conducting liquid, by photo-lithographically etching a homogenous electro-conductive layer, or by other known ways. The thickness of seed layer 312 is of no critical importance and may be, depending on the seed layer type, in a range between a few nanometers and a few micrometers. If seed layer structure 312 has been produced by a laser, the seed layer may simply be a layer of conducting particles in the insulating polymer layer and exposed to the polymer layer surface. In the embodiment of FIGS. 5A-5E, first seed layer element 312a is chosen to have a large minimum structure width as a base for a metal layer 318 with a large structure width, e.g. for high current capability, while second seed layer element 312b is chosen to have a small minimum structure width as a base for a metal layer 314 with a small structure width that requires less area on insulating layer 308 for any given circuitry.

Figure 5B:
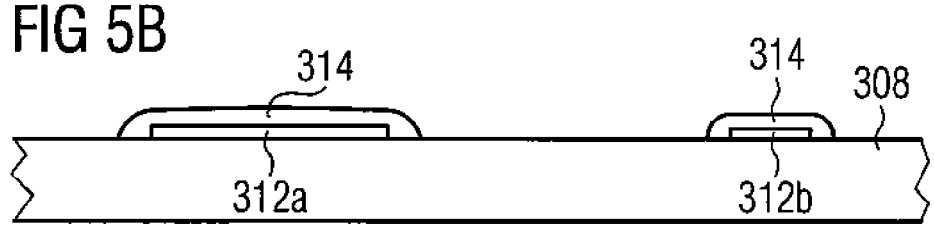

FIG. 5B discloses the two seed layer elements 312a, 312b after applying a metal ions containing solution to insulating layer 308 to produce first metal layer 314 on the two seed layer elements 312a, 312b by electrochemically grow a first metal layer 314 on the two seed layer elements 312a, 312b. The thickness of the electrochemically grown first metal layer 314 is kept small, e.g. 0.1 to 10 micrometer, compared to the second metal layer 318 that is to be grown at a later stage. The small thickness of first metal layer 314 is to limit the minimum structure width of first metal layer 314 since during the electrochemical growth of first metal layer 314, first metal layer 314 not only expands in a direction orthogonal to insulating layer 308 but also in a direction lateral to insulating layer 308, as indicated in FIG. 5B.

Figure 5C:
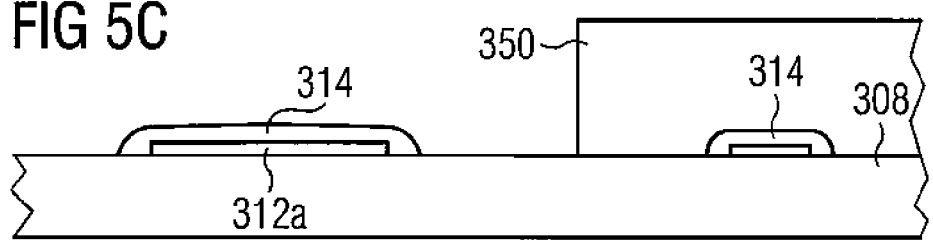

FIG. 5C discloses the cross section view of FIG. 5B after a mask 350 is applied over insulating layer 308 that selectively covers first metal layer 314. Mask 350 is used to cover the regions of those first metal layer elements 314 that are meant to maintain a small total metal layer thickness, i.e. a small minimum structure width. The mask may be applied to insulating layer 308 in known ways, e.g. by applying a photoresist (e.g. PMMA or polyimide or epoxy resin) to insulating layer 308, and photo-lithographically structuring the photoresist layer.

Figure 5D:
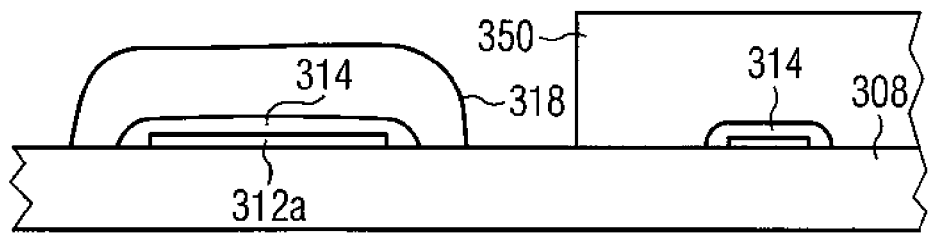
Figure 5E:
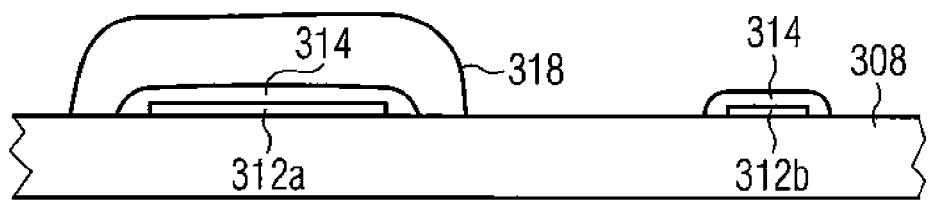

FIG. 5D discloses the cross section view of FIG. 5C after a metal ions containing solution has been applied to insulating layer 308. Due to mask 350, the metal ions containing solution reaches only those regions of first metal layer 314 that are not covered by mask 350. Accordingly, due to interaction with the metal ions containing solution, a second metal layer 318 is grown only on the first metal layer element that covers first seed layer element 312a. As a result, due to the larger structure width of first seed layer element 312a and the larger total thickness of the combined thickness of first metal layer 314 and second metal layer 318, the cross section area for conducting a large current through second metal layer 318 is significantly larger than the cross sectional area of first metal layer elements 314 covered by mask 350. Finally, FIG. 5E discloses the cross section view of FIG. 5D after mask 350 has been removed, e.g. by washing it off or by ashing. Note that the removal of the mask is not a requirement since mask layer 350 may also remain in the package.

Figure 6A:
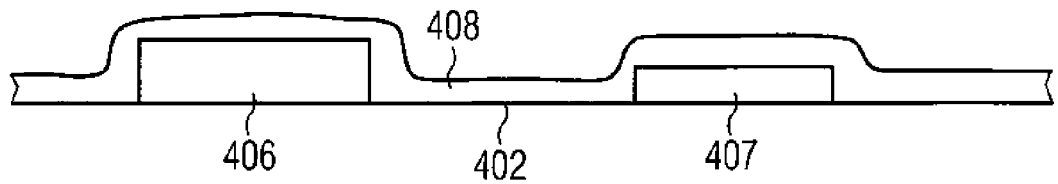
FIGS. 6A to 6E schematically disclose a further embodiment of the method of manufacturing an electronic device wherein the first metal layer is a thick metal layer connected to a first chip (e.g. a power chip), and the second metal layer is a thin metal layer connected to a second chip (e.g. logic chip).

FIGS. 6A-6E schematically disclose a further embodiment of manufacturing an electronic device wherein a first chip 406 and a second chip 407 are placed on a common carrier 402. In one embodiment, first chip 406 may be a logic chip, e.g. a chip with a CMOS circuit, and second chip 407 may be a power chip, i.e. a chip that comprises at least one power transistor for switching a large current, e.g. a current in the range of 100 mA up to 100 A, or higher. As indicated in FIG. 6A, power chip 407 may be thinner than logic chip 406. For example, power chip 407 may have been thinned to a range between, say, 20 to 200 micrometers while logic chip 406 may have a thickness of, say, 400 to 800 micrometers. The small thickness of power chip 407 is to reduce the On-Resistance of the power transistors. In addition to the thinning, both chips, due to their diverse functionalities, may have been produced by different manufacturing technology steps so that it may be difficult to integrate the functionalities of the two chips on one chip.

Further, power transistor of second chip 407 may be a vertical transistor that is capable of controlling a current flowing from the upper surface of the chip to the lower surface, or vice versa. Accordingly, second chip 407 may have a first electrode on the upper surface of second chip and a second electrode on the lower surface. In this case, carrier 402 may comprise a conductive chip island, and second chip 407 may be soldered, diffusion soldered, or with an electrically conducting glue attached to the chip island to provide an electroconductive connection to the chip island. First chip 406, as a logic chip, may also be glued with an electrically insulation glue.

FIG. 6A further discloses an insulating layer 408 applied over logic chip 406, carrier 402 and power chip 407. Insulating layer 408, in this embodiment, is a polymer layer that contains metal, metal complexes or ceramic particles, e.g. AlN-particles of a diameter up to several micrometers (see FIGS. 3B-3F). However, in other embodiments, insulating layer 408 may be of any of the other materials mentioned before. The thickness of polymer layer 408 may be, for example, in the micrometer range. The polymer layer 408 may be deposited in any of the methods described above.

Figure 6B:
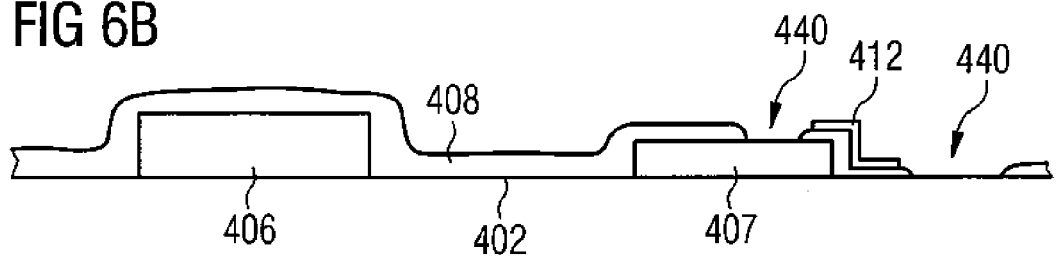

FIG. 6B discloses FIG. 6A after first openings 440 through polymer layer 408 (insulating layer) have been provided for accessing the high current aluminium contact pad (drain or source) of power chip 407 and high current contact pad of carrier 402 from the upper side of polymer layer 408. The diameter of first openings 440 may be in the range of 150 micrometer or more to allow for a low ohmic connection between power chip 407 and carrier 402. Further, a first structure 412 is shown in FIG. 6B that is produced between the two first openings 440. First structure 412 serves as a first seed layer structure (first structure) for producing a first metal layer 414. First seed layer structure 412 is indicated in FIG. 6B by the fat line connecting the two first openings 440. First seed layer structure 412 is produced by a laser beam directed onto polymer layer 408 to evaporate the polymer in the region of interaction and to break the AlN-particles into conducting Al-particles and other particles (see FIG. 3C).

The first openings 440 may be produced in known ways, e.g. by an etching process selectively to a photo-lithographically structured mask (not shown). Alternatively, first openings 440 may be produced by a laser beam.

Figure 6C:
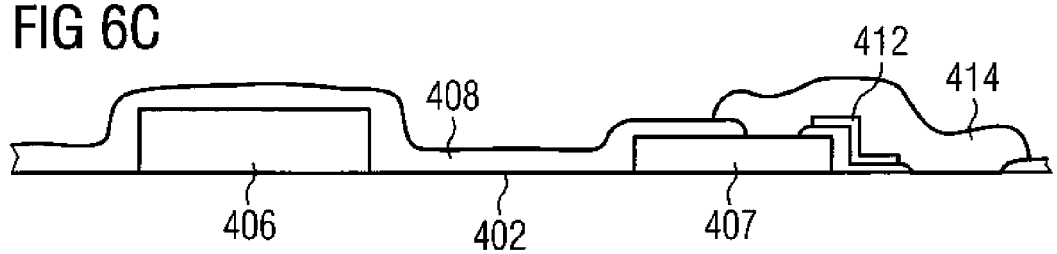

FIG. 6C discloses the embodiment of FIG. 6B with the difference that after production of first seed layer structure 412, a metal ions containing solution is applied to insulating layer 408 to produce first metal layer 414 on first seed layer structure 412, on the contact pad of power chip 407 and on the contact pads of carrier 402 underneath the first openings 440. The contact pads are typically made of aluminium or copper. The application of the metal ions containing solution may be carried out by immersing the surface of polymer layer 408 into the metal ions containing solution. The metal ions containing solution may be one of the solutions mentioned above. Since first metal layer 424 is designed to carry large currents to or away from power chip 407, the thickness of first metal layer 414 may be as large as 100 micrometers or larger.

Figure 6D:
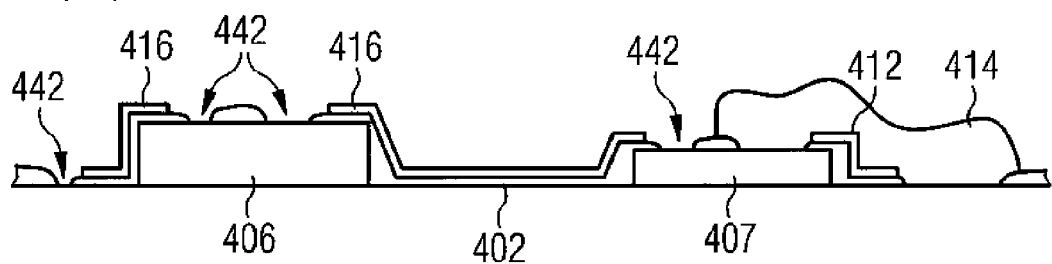

FIG. 6D discloses the embodiment of FIG. 6C with the difference that after production of first metal layer 414, several second openings 442 through polymer layer 408 have been produced above carrier 402, above two contact pads of logic chip 406 and above a contact pad of power chip 407. The second openings 442 have a small diameter, e.g. less than 100 micrometer, since they are meant to provide for logical signals only. The second openings 442 may be produced in the same way as the first openings 440.

Further, a second seed layer structure 416 (second structure) is shown in FIG. 6D that is produced between one second openings 442 on carrier 402 and one second openings 442 on logic chip 406, and between one second openings 442 on logic chip 406 and one second openings 442 on power chip 407. Similar to first seed layer structure 412, second seed layer structure 416 serves as a second seed layer structure 416 for a growing second metal layer 418 (see FIG. 6E). The position of second seed layer 416 is indicated in FIG. 6D by the two fat lines connecting the respective second openings 442. Like first seed layer 412, second seed layer 416 may be produced by a laser beam directed onto polymer layer 408 to evaporate the polymer in the region of interaction and to break conducting Al-particles out of the insulating AlN-particles (see FIG. 3C).

Figure 6E:
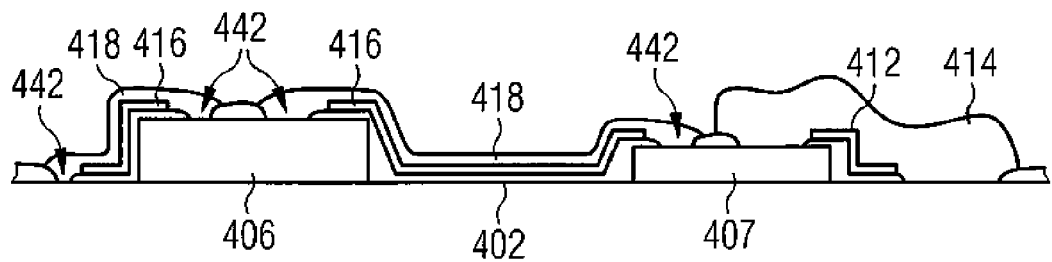

FIG. 6E discloses the embodiment of FIG. 6D with the difference that after production of second seed layer structure 416, a metal ions containing solution is applied to insulating layer 408 to produce second metal layer 418 on second seed layer structure 416, on first metal layer 414, on the aluminium contact pads of logic chip 406, on the aluminium contact pads of power chip 407, and on the aluminium contact pads of carrier 402 underneath second openings 442. Like for first metal layer 414, second metal layer 418 may be produced by immersing the surface of polymer layer 408 into the metal ions containing solution. Since second metal layer 418 is designed to transport logic signals to or away from logic chip 406 and power chip 407, the thickness of second metal layer 18 may be as small as 10 micrometers or even smaller.

FIG. 7A and the sequence of FIGS. 7B to 7E disclose a multi-chip module 500 (electronic device) designed for a power application, and a method of producing the module using the process described in FIGS. 6A-6E.

Multi-chip module 500 of FIG. 7A is comprised of a carrier based on ceramic, polymer or epoxy compound plate, covered with a structured copper layer. The copper layer is structured to provide for external contact elements 580, a first chip island 582 for attachment of controller chip 506, second chip island 584 for attachment of the high-side power transistor chip 507a, third chip island 586 for attachment of low-side power transistor chip 507b, and power rail 588. Controller chip 506, high-side power transistor chip 507a and low-side power transistor chip 507b are each soldered to their respective island 582, 584, 586.

For manufacturing multi-chip module 500, the chips are soldered to their respective chip islands on carrier 502 (FIG. 7B). Further, carrier 502 and chips 506, 507a. 507b are evenly covered with a polymer layer (not shown in FIG. 7A and FIG. 7B-7E) in a way as described in FIG. 6A. The thickness of the polymer layer is bigger than 5 micrometers. It follows a step wherein the polymer layer is structured a first time to produce large openings (not shown in FIG. 7A and FIG. 7B-7E) above the source contact pads of the high-side power transistor chip 507a, the source contact pads of low-side power transistor chip 507b, and the power rail 588. Afterwards, a first seed layer structure 512 (first structure) comprised of two seed layer structure elements (see FIG. 7B) is produced. The first seed layer structure elements 512 on the polymer layer extend from one the large opening to the other large opening in the insulating layer in a way as described in FIG. 6B. First seed layer structure 512 serves to define the structure of first metal layer 514 (see FIG. 7A and FIG. 7C). As can be seen, the first seed layer structure elements 512 have about the same structure width, e.g. 100 micrometers or more.

As can be seen in FIG. 7B, one of first seed layer elements 512 extends from a respective large opening above power rail 588 to a respective large opening above the source of low-side power transistor chip 507b, while the other element of first seed layer 512 extends from a large opening above third chip island 586 to a large opening above the source of high-side power transistor chip 507a.

FIG. 7C discloses carrier 502 after the polymer layer has been covered with a metal ions containing solution such that the metal ions of the metal ions containing solution can electrochemically interact with the first seed layer structure elements 512 and the exposed source contact pads to form first metal layer 514. First metal layer 514 is comprised of the two first metal layer elements, as shown in FIGS. 7A and 7C. The lateral shape of first metal layer 514 is essentially the same as the lateral shape of the first seed layer structure elements 512 shown in FIG. 7B. The thickness of first metal layer 514 is chosen to be large in order to provide for large cross sections area connection between power rail 588 and the source of the low-side power transistor chip 507b, and between the third chip island 586 and the source of high-side power transistor chip 507a. The thickness of the first metal layer elements 514 may be the same as the first metal layer 414 described in FIGS. 6C-6E.

FIG. 7D discloses carrier 502 of FIG. 7C after the polymer layer is structured a second time to produce small openings (not shown in FIGS. 7A and 7D) above the gate contact pad of the high-side power transistor chip 507a, above the gate contact pad of low-side power transistor chip 507b, and above the contact pads of control chip 506. In addition, a second seed layer structure 516 (second structure) is produced on the polymer layer (not shown in FIG. 7A) that connects the small openings in a way as described in FIG. 6D. Second seed layer structure 516 consists of fine line elements serving as a second seed layer to define the structure of second metal layer 518. As can be seen in FIG. 7D, the minimum structure width of second seed layer 516 is much smaller than the minimum structure width of first seed layer 512, e.g. 20 micrometers. The small structure width of second metal layer 518 makes it possible to place a complex wiring on the carrier. This way, complex modules containing as many components as controller chip 506a, high-side power chip 507a, and low-side power chip 507b, multiple contact elements 580, and more, can be interconnected on only one insulating layer.

FIG. 7E discloses carrier 502 of FIG. 7D after a metal ions containing solution has been applied to polymer layer for a second time to produce second metal layer 518 by electrochemical interaction of the metal ions containing solution interact with the second seed layer elements 516, and with the exposed contact pads. Due to the small structure width of the second seed layer elements 516, the minimum structure width of the second metal layer elements 518 is small as well. The thickness of second metal layer 518 is chosen to be small as well, e.g. 10 micrometer, in order to maintain the minimum structure width of the first metal layer 14 small. Finally, after first metal layer 514 and second metal layer 518 have been produced, the multi-chip module may be moulded to mechanically and chemically protect the multi-chip module from external environment.

The method of manufacturing semiconductor devices can be applied to various packaging platforms. For example, while the embodiments of FIGS. 7A to 7E shows an electronic device 500 where the carrier 502 is made of an insulating material, the method of manufacturing can also be applied to a carrier made of a conducting material, e.g. on a copper sheet.

Figure 8A:
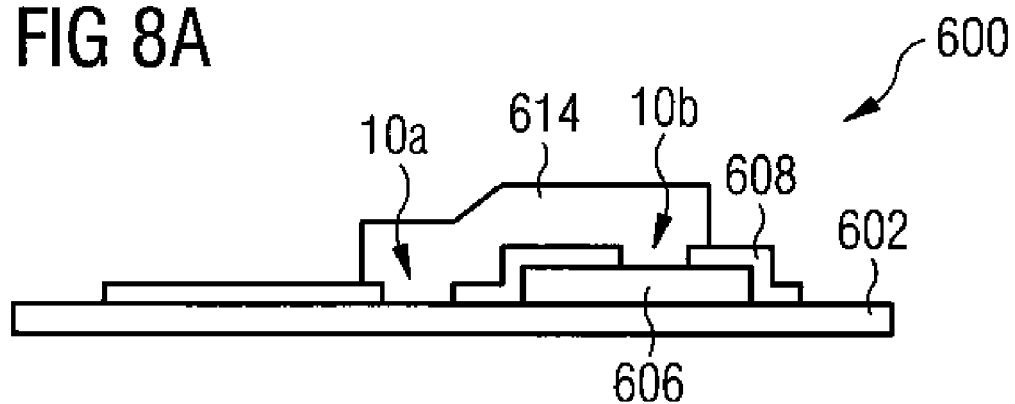
FIGS. 8A to 8C discloses a further embodiment of the method of manufacturing an electronic device wherein the carrier is a copper sheet.
Figure 8B:
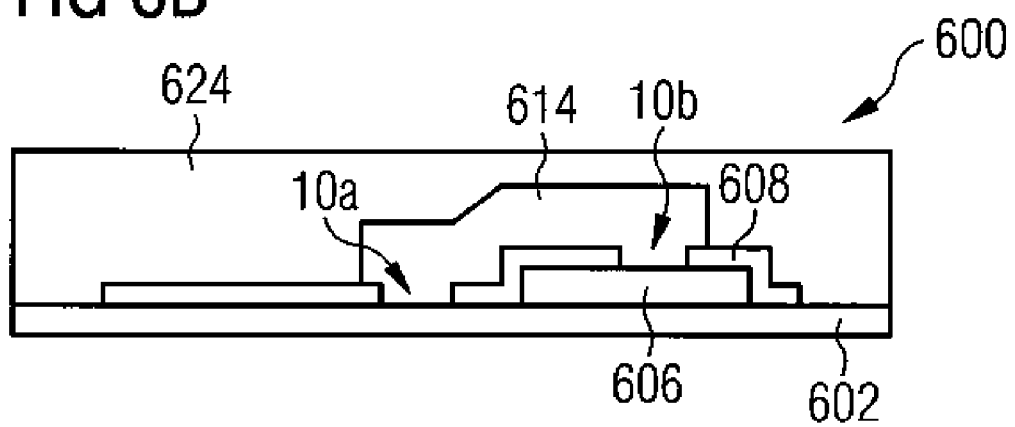
Figure 8C:
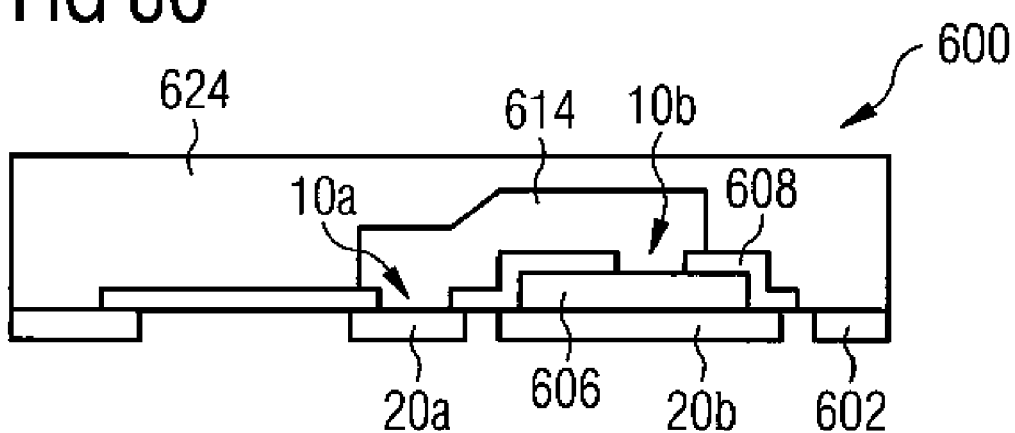

FIGS. 8A to 8C disclose a semiconductor device 600 where carrier 602 is a copper sheet element with a thickness of, say, 200 micrometer. Chip 606 may be soldered or glued to carrier 602. Insulating layer 608 may be applied and structured in the same way as described in the embodiment of FIG. 1A-1D. FIG. 8A further discloses first metal layer 614 electrically connecting chip 606 with carrier 602 via the two large through-holes 10a, 10b through insulating layer 508. The embodiment may further include a second metal layer (not shown) having a different layer thickness. Generally, the embodiment of FIGS. 8A-8C may be the same as of FIG. 1A-1D with the only difference that carrier 602 is made of an electrically conducting material.

FIG. 8B discloses the embodiment of FIG. 8A after semiconductor device has been moulded with moulding material 624 to protect chip 606, insulating layer 608, first metal layer 614 and second metal layer from mechanical and chemical destruction by the environment.

FIG. 8C discloses the embodiment of FIG. 8B after copper carrier 602 has been structured to serve as external input/output connection pads 20a, 20b connecting chip 608 to the outside world. The structuring of carrier 602 may be carried out by selectively etching the carrier, by sawing, or any other convenient method. The external connection pads 20a, 20b may be used to solder semiconductor device 600 to a printed circuit board to connect semiconductor device 600 to the outside word. For example, if chip 606 is a vertical power transistor with a source and gate contact on the front side of chip 602 and a drain contact on the backside of chip 602, external connection pad 20a may connect the outside world to the source contact via first metal layer element 614 while external connection pad 20b may connect the outside world to the drain contact via the backside of chip 602. Further external connection pads may be involved, at least one of them to connect the outside world to the gate contact on the chip front side.

Note that the manufacturing of an electronic device like the one shown in FIG. 8A-8C is well suited to be carried out in the batch mode. In this case, an array of chips 606 may be soldered on a common carrier. Further, an insulating layer 608 may be applied over the common carrier and the chips. Afterwards, insulating layer 608 is structured to open the contacts of the chips and on the carrier. Further, a first metal layer 614 is produced over the array of chips and the common carrier to contact the chips with metal layer elements having a first layer thickness. Afterwards, a second metal layer 618 is produced over the array of chips and the common carrier to contact the chips with metal layer elements having a second layer thickness. Afterwards, moulding material 624 is applied over the array of chips and the common carrier. After moulding, the common carrier is structured to obtain individual external connection pads 20a, 20b for each chip 606. Finally, by etching or sawing through the moulding material, the array of chips is singulated to obtain multiple single devices 600 of the kind as shown in FIG. 8C.

FIGS. 9A-9D illustrate a further embodiment that may be the same as the one shown in FIGS. 8A-8D with the difference that carrier 702 is not a copper sheet element but a tape or foil that later is removed from semiconductor device 700.

Figure 9A:
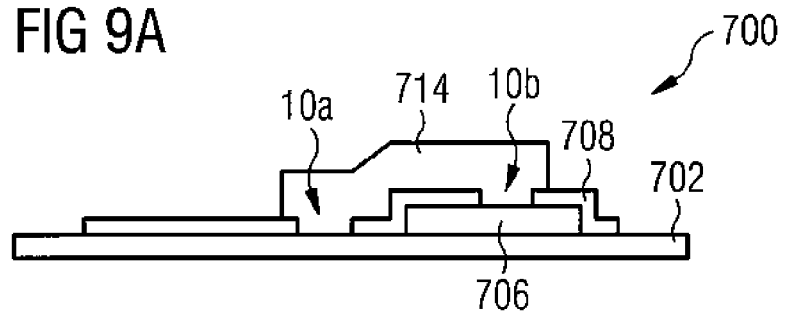
FIGS. 9A to 9D schematically discloses a further embodiment of the method of manufacturing an electronic device wherein the carrier is a tape or foil.

FIG. 9A illustrates an electronic device 700 like the one shown in FIG. 8A. The only difference is that chip 706, insulating layer 708, first metal layer 714 and second metal layer (not shown) are attached, or applied, to a flexible carrier 702, e.g. a copper foil.

Figure 9B:
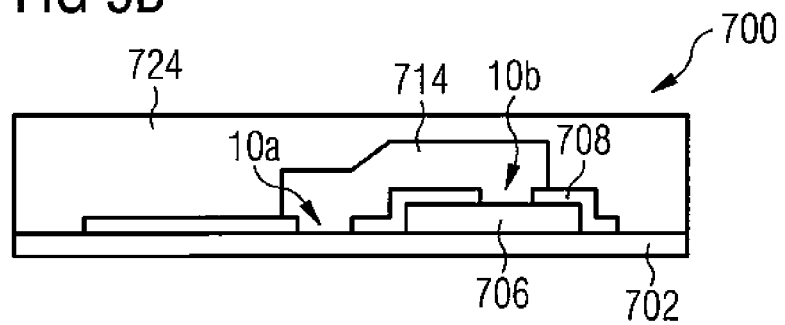

FIG. 9B show the electronic device 700 of FIG. 9A after moulding so that carrier 702, chip 706, insulating layer 708, first metal layer 714 and second metal layer 718 are covered with moulding material 724.

Figure 9C:
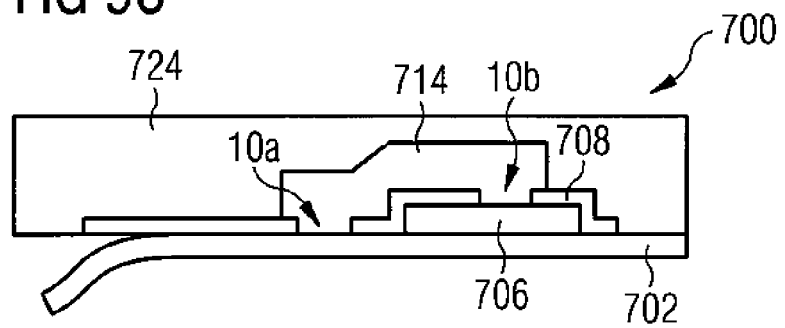
Figure 9D:
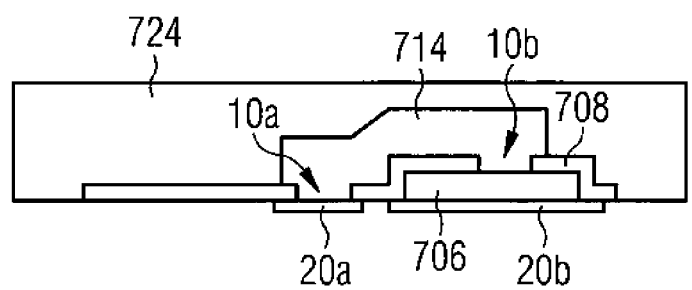

FIG. 9C illustrates the process of removing the carrier 702 from semiconductor device 700 by pulling the copper foil from the moulding material 724, the insulating layer 708 and the electrochemically grown first metal layer 714 and second metal layer. Afterwards, external contact elements 20a, 20b may be applied to the exposed first metal layer 714 and second metal layer elements. The external contact elements may be solder balls, galvanically grown surface layer elements, or any other element whose production is well known in the art (FIG. 9D).

What is claimed is:

1. A method of manufacturing an electronic device comprising:
   placing a first chip on a carrier;
   applying an insulating layer over the first chip and the carrier;
   applying a metal ions containing solution to the insulating layer for producing a first metal layer of a first thickness; and
   producing a second metal layer of a second thickness on the insulating layer wherein at least one of the first first metal layer and the second metal layer comprises at least a portion that is laterally spaced apart from the respective other metal layer.

2. The method of manufacturing an electronic device according to claim 1 wherein the second metal layer is produced by applying a metal ions containing solution to the insulating layer.

3. The method of manufacturing an electronic device according to claim 1 wherein the second metal layer is produced after production of the first metal layer.

4. The method according to claim 1 further comprising producing a first structure on the insulating layer for producing the first metal layer.

5. The method according to claim 4 further comprising producing a second structure on the insulating layer for producing the second metal layer.

6. The method according to claim 5 wherein the second structure is produced after production of the first metal layer.

7. The method according to claim 5 wherein the second structure is produced by at least one of irradiating the insulating layer with a laser, selectively applying a conducting liquid, selectively removing regions of an electroconductive layer applied over the insulating layer, by inkjetting, by tampon printing, by stencil printing, by screen printing, by needle dispensing, and by selective spray coating.

8. The method according to claim 4 wherein the second metal layer is produced by applying a metal ions containing solution to a selective region of the first structure.

9. The method according to claim 4 wherein the first structure is produced by at least one of irradiating the insulating layer with a laser, selectively applying a conducting liquid, selectively removing regions of an electroconductive layer applied over the insulating layer, by inkjetting, by tampon printing, by stencil printing, by screen printing, by needle dispensing, and by selective spray coating.

10. The method according to claim 4 wherein the metal ions containing solution is applied while applying a voltage between the metal ions containing solution and the first structure.

11. The method according to claim 1 further comprising placing at least one second chip on the carrier.

12. The method according to claim 1 wherein the insulating layer is applied by means of at least one of liquid phase deposition, chemical vapour deposition (CVD), physical vapour deposition (PVD), plasma gas phase deposition, spray coating, needle dispensing, spin-on coating, and dip coating.

13. The method according to claim 1 further comprising producing through-holes through the insulating layer.

14. The method according to claim 1 further comprising soldering the first chip to the carrier.

15. The method according to claim 1 further comprising covering the first chip with a moulding compound.

16. A method of manufacturing an electronic device comprising:
    placing a first chip on a carrier;
    applying an insulating layer over the carrier and the chip;
    irradiating the insulating layer layer with a laser for producing a first structure;
    applying a metal ions containing solution to the first structure for producing a first metal layer;
    irradiating the insulating layer with a laser for producing a second structure after the production of the first metal layer; and
    applying a metal ions containing solution to the second structure for producing a second metal layer.

17. A method of manufacturing an electronic device comprising:
    placing a first chip on a carrier;
    applying an insulating layer over the first chip and the carrier;
    selectively applying a conducting liquid to the insulating layer for producing a first structure;
    applying a metal ions containing solution to the first structure for producing a first metal layer; and
    after production of the first metal layer, selectively applying a conducting liquid to the insulating layer for producing a second metal layer of which at least a portion is laterally spaced apart from the first metal layer.

18. A method of manufacturing an electronic device comprising:
    placing a first chip on a carrier;
    applying an insulating layer over the first chip and the carrier;
    producing a first structure on the insulating layer;
    applying a metal ions containing solution to the first structure for producing a first metal layer;
    masking the first structure; and
    applying a metal ions containing solution to the masked first structure for producing a second metal layer of which at least a portion is laterally spaced apart from the first metal layer.

* * * * *

UNITED STATES PATENT AND TRADEMARK OFFICE
CERTIFICATE OF CORRECTION

| | | |
|---|---|---|
| PATENT NO. | : 7,799,601 B2 | |
| APPLICATION NO. | : 12/018847 | |
| DATED | : September 21, 2010 | |
| INVENTOR(S) | : Nikitin et al. | |

It is certified that error appears in the above-identified patent and that said Letters Patent is hereby corrected as shown below:

Column 16, line 47, the text "first first" should read --first--.

Signed and Sealed this
First Day of February, 2011

David J. Kappos
*Director of the United States Patent and Trademark Office*